US 8,154,091 B2

(12) United States Patent
Dubourdieu et al.

(10) Patent No.: US 8,154,091 B2
(45) Date of Patent: Apr. 10, 2012

(54) INTEGRATED ELECTRONIC CIRCUIT INCLUDING A THIN FILM PORTION BASED ON HAFNIUM OXIDE

(75) Inventors: Catherine Dubourdieu, Grenoble (FR); Erwan Yann Rauwel, Oslo (NO); Vincent Cosnier, Grenoble (FR); Sandrine Lhostis, Theys (FR); Daniel-Camille Bensahel, Grenoble (FR)

(73) Assignees: Centre National de la Recherche Scientifique-CNRS, Paris Cedex (FR); Institut National Polytechnique de Grenoble, Grenoble Cedex (FR)

( * ) Notice: Subject to any disclaimer, the term of this patent is extended or adjusted under 35 U.S.C. 154(b) by 0 days.

(21) Appl. No.: 12/597,738

(22) PCT Filed: Apr. 25, 2008

(86) PCT No.: PCT/FR2008/050753
§ 371 (c)(1),
(2), (4) Date: Oct. 26, 2009

(87) PCT Pub. No.: WO2008/155490
PCT Pub. Date: Dec. 24, 2008

(65) Prior Publication Data
US 2010/0059834 A1    Mar. 11, 2010

(30) Foreign Application Priority Data
Apr. 27, 2007  (FR) .................................. 07 03089

(51) Int. Cl.
*H01L 31/119* (2006.01)
(52) U.S. Cl. .................. 257/411; 257/368; 257/410

(58) Field of Classification Search ............... 257/410, 257/411, 386
See application file for complete search history.

(56) References Cited

U.S. PATENT DOCUMENTS

| 3,938,064 | A | 2/1976 | O'Bryan, Jr. et al. |
| 4,860,064 | A * | 8/1989 | Luryi ............................. 257/14 |
| 2003/0054669 | A1 * | 3/2003 | Alluri et al. .................. 438/785 |
| 2004/0028952 | A1 | 2/2004 | Cartier et al. |
| 2004/0191997 | A1 | 9/2004 | Kawahara et al. |
| 2005/0040481 | A1 | 2/2005 | Shimizu et al. |
| 2005/0142715 | A1 | 6/2005 | Sakoda et al. |

FOREIGN PATENT DOCUMENTS
WO       WO 0194662       * 12/2001

OTHER PUBLICATIONS

PCT Search Report and Written Opinion, PCT/FR2008/050753, dated Dec. 22, 2008.
Wu Kaisheng et al., "Thermodynamic Assessment of the HfO2-MgO System", Calphad vol. 21, No. 3, pp. 411-420, 1997, PII S0364-5916(97) 00041-2.
Xinyuan Zhao et al; First-principles study of structural, vibrational, and lattice dielectric properties of hafnium oxide; Physical Review B, vol. 65, 233106, 2002 The American Physical Society, pp. 233106-1 through 233106-4.

* cited by examiner

*Primary Examiner* — Long Pham
(74) *Attorney, Agent, or Firm* — Gardere Wynne Sewell LLP

(57) ABSTRACT

An integrated electronic circuit has a thin layer portion based on hafnium oxide. This portion additionally contains magnesium atoms, so that the portion is in the form of a hafnium-and-magnesium mixed oxide. Such a portion has a high dielectric constant and a very low leakage current. It is particularly suitable for forming a part of a gate insulation layer of a MOS transistor or a part of a MIM capacitor dielectric.

28 Claims, 1 Drawing Sheet

INTEGRATED ELECTRONIC CIRCUIT INCLUDING A THIN FILM PORTION BASED ON HAFNIUM OXIDE

PRIORITY CLAIM

The present application is a 371 filing from PCT/FR2008/050753 filed Apr. 25, 2008 which claims priority from French Patent Application No. 07 03089 filed Apr. 27, 2007, the disclosures of which are hereby incorporated by reference to the maximum extent allowable by law.

BACKGROUND OF THE INVENTION

1. Technical Field of the Invention

The present invention relates to an integrated electronic circuit which comprises a thin layer portion based on hafnium oxide. It also relates to a process for forming such a thin layer, as well as the use of this process for realizing an integrated electronic circuit.

2. Description of Related Art

It is known to use thin layers of hafnium oxide, of the chemical formula $HfO_2$, in the fabrication of integrated circuits, particularly for realizing portions of material with a high dielectric permittivity. But this high dielectric permittivity depends on the crystallographic structure of the hafnium oxide. In its monoclinic phase, hafnium oxide has a relative dielectric permittivity $\in_r$ which is between 16 and 20, and this value is between 25 and 80 when the hafnium oxide has a cubic, tetragonal, or orthorhombic structure.

Currently, hafnium oxide obtained in the fabrication of integrated circuits is either monoclinic or amorphous. When it is amorphous, it later crystallizes in monoclinic form when the circuit is heated during fabrication, after the formation of the hafnium oxide portion. The relative dielectric permittivity of the hafnium oxide portion is then once again below about 20.

Hafnium oxide portions additionally containing atoms of scandium (Sc), yttrium (Y), aluminum (Al) or titanium (Ti) have also been realized in integrated circuits, in order to stabilize an amorphous phase of a mixed oxide of hafnium and one of these metals. But for these added metals, the mixed oxide material which is obtained still has an insufficient dielectric permittivity. In addition, for some of them, the mixed oxide material again crystallizes into a monoclinic structure.

The exists a need in the art for a material based on hafnium oxide, adapted for the fabrication of integrated electronic circuits and having a high dielectric permittivity.

There is also a need in the art for a material based on hafnium oxide, adapted for the realization of electrically insulating portions having very low leakage currents.

SUMMARY OF THE INVENTION

In an embodiment, an integrated electronic circuit comprises at least one thin layer portion based on hafnium oxide, with this portion additionally containing magnesium atoms in the form of a mixed oxide of hafnium and magnesium.

The phrase "thin layer" is understood to mean a layer of material which has two substantially parallel faces separated by a layer thickness of less than 5 micrometers. The mixed oxide material in the form of such a thin layer is particularly suitable for the fabrication of an integrated electronic circuit which has a structure of layers superimposed on a substrate.

The phrase "hafnium-magnesium mixed oxide" is understood to mean one of the following: a homogeneous oxide compound of these two metals, or a mixture of such a compound and magnesium oxide MgO, or a mixture of magnesium oxide MgO and hafnium oxide $HfO_2$. In general, a hafnium-magnesium mixed oxide as discussed herein corresponds to the formula $HfMg_xO_y$, where x and y are stoichiometric coefficients which are not necessarily integers.

Because of the presence of magnesium atoms in the portion, in combination with the hafnium oxide, the thin layer portion which is obtained has a high relative dielectric permittivity. This permittivity is preferably greater than 25 and less than 80.

This range of values for the relative dielectric permittivity of the thin layer portion corresponds to the fact that the mixed oxide material is amorphous, as can be determined by X-ray diffraction analysis. However, at least some part of it has a crystalline structure which is cubic, tetragonal, or orthorhombic, with very small grains. The amorphous form is particularly advantageous for realizing a gate insulation layer of a MOS transistor. In fact, it eliminates the appearance of resonance phonons which can modify the conductivity of the transistor channel. Such a detrimental interaction between the gate insulation layer and the channel is well known and is commonly called remote phonon scattering.

Certain advantages of the range of values 25-80 for the relative dielectric permittivity of a thin layer portion of hafnium-magnesium mixed oxide become particularly clear when considering a silica thickness which is electrically equivalent to the actual thickness of this portion. This equivalent oxide thickness (EOT) is equal to:

$$EOT = \frac{\varepsilon_r(SiO_2)}{\varepsilon_r} \times e$$

where $\in_r$ and e respectively designate the relative dielectric permittivity and the actual thickness of the thin layer portion of hafnium-magnesium mixed oxide, and $\in_r(SiO_2)$ indicates the relative dielectric permittivity for silica. The term $\in_r(SiO_2)$ is usually equal to about 3.9.

Thus, to obtain an equivalent oxide thickness EOT of about 1.6 nm (nanometers) for a gate insulation layer of a MOS transistor, the actual thickness e of this layer is between 12.3 and 20.5 nm when it is constituted of hafnium-magnesium mixed oxide with a relative dielectric permittivity $\in_r$ of between 30 and 50. Such actual thicknesses of a gate insulation layer are greater than those of electrically equivalent silica insulation layers, and so the tunnel leakage currents through the gate insulation layer are greatly reduced. Such actual thicknesses for the gate insulation layer of MOS transistors are also not too large relative to the integrated circuit design. In particular, the resulting gate insulation layer portions do not adversely affect the mechanical solidity of a circuit realized of superimposed layers, and no point effect appears which could cause the circuit to break down. For these reasons, the range of values 30 to 50 is more particularly preferred for the relative dielectric permittivity of a hafnium-magnesium mixed oxide according to embodiments herein.

A thin layer portion of hafnium-magnesium mixed oxide can therefore advantageously constitute at least a part of a gate insulation layer of a MOS transistor in an integrated electronic circuit. It has also been observed that such a portion of hafnium-magnesium mixed oxide has the following additional advantages for this application:

it has no irreversible charge effect, such that no hysteresis appears during a dielectric polarization cycle of the portion, and compared to a portion of pure hafnium oxide (HfO$_2$), the introduction of magnesium atoms (Mg) changes the work function of the portion's electrons to values closer to the threshold of the silicon conduction band. This threshold of the silicon conduction band is at about −4.05 eV relative to the free state of an electron. A portion of hafnium-magnesium mixed oxide according to the invention is therefore particularly advantageous for realizing a PMOS transistor.

In another application, a thin layer portion of hafnium-magnesium mixed oxide can also constitute at least part of a dielectric of a capacitor in the circuit. Such a capacitor can in particular be a MIM ("Metal-Insulator-Metal") capacitor. It can also be an uncoupling capacitor, a capacitor for an analog circuit, a memory capacitor, etc.

In an embodiment, a process for forming on a substrate a thin layer containing a hafnium-magnesium mixed oxide comprises the following steps: heating the substrate within a vessel which contains oxygen, connecting, by means of an injector, at least one injection aperture accessing the inside of the enclosure, to one or more sources of volatile precursors of hafnium and magnesium, with these precursors being in the form of a liquid at the sources, and controlling the opening of the injector so as to adjust the quantity of hafnium and magnesium precursors inside the vessel.

Preferably, a first source of hafnium precursor and a second source of magnesium precursor are connected to the vessel by respective separate injectors. The respective periods during which the two injectors are open can then be adjusted to obtain a proportion of magnesium atoms in the layer which is between 15% and 50% relative to the total quantity of magnesium and hafnium atoms contained in the layer. More specifically, this proportion is between 20% and 40% for the highest values obtained for the dielectric permittivity. In addition, the hafnium and magnesium precursors are preferably organometallic compounds which contain alkyl or alkoxide ligands. The volatility and reactivity of such precursors only require simple and easily available equipment in order to implement a process of the invention.

Such a process can be used in particular to fabricate an integrated electronic circuit which incorporates at least one thin layer portion containing a hafnium-magnesium mixed oxide. In particular, such a portion of hafnium-magnesium mixed oxide can be obtained with a deposition rate which is close to the rate for a portion of pure hafnium oxide (HfO$_2$), and can be etched in the same manner. The use of a portion of hafnium-magnesium mixed oxide can therefore be easily integrated into the fabrication of an integrated electronic circuit.

BRIEF DESCRIPTION OF THE DRAWINGS

Other features and advantages of the invention will become clear in the following non-limiting example of an embodiment, described with reference to the attached drawings in which.

DETAILED DESCRIPTION OF THE DRAWINGS

Embodiments are now described in detail in a context of realizing a thin insulation layer for MOS transistor gates as part of an integrated electronic circuit. It is understood that this application is only provided as an example, and that portions of hafnium-magnesium mixed oxide can be used for other applications, within electronic circuits or in other devices.

Figure 1:
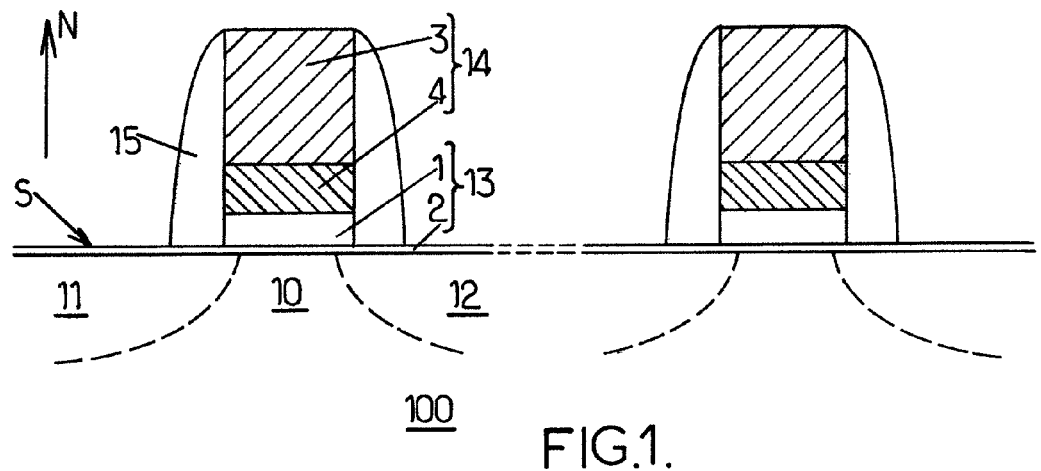
FIG. 1 is a cross-section view of an integrated electronic circuit incorporating a MOS transistor.

FIG. 1 represents a portion of an integrated electronic circuit which comprises two MOS transistors. The transistors are identical here for illustrative purposes only. For sake of clarity in FIG. 1, the dimensions of the represented parts of the electronic components do not correspond to the actual sizes or size ratios. N indicates a direction which points towards the top of FIG. 1 and which is perpendicular to a surface of a substrate of the circuit, with the circuit being located in the lower part of FIG. 1. The words "on", "under", "below", and "above" as used in the following description are relative to this orientation.

According to FIG. 1, the integrated electronic circuit comprises a substrate 100, of monocrystalline silicon (mono-Si) for example. The MOS transistors are realized on the surface of the substrate. The surface of the substrate 100 is labeled S. Each of the transistors comprises a source zone and a drain zone, labeled 11 and 12 and positioned on two opposite sides of a channel 10 of the transistor. The zones 11 and 12 as well as the channel 10 are realized by appropriately doping the substrate 100 in a manner which is known per se for MOS transistors.

A gate structure is formed above the channel 10, on the surface S of the substrate 100. It comprises a gate insulation layer portion 1, a gate portion 14, and a spacer 15.

The portion 1 is constituted of a hafnium-magnesium mixed oxide HfMg$_x$O$_y$. Preferably, the proportion of magnesium atoms relative to the total quantity of magnesium and hafnium atoms contained in the portion 1, meaning the ratio x/(1+x), is between 0.15 and 0.50. In this case, the portion 1 has a relative dielectric permittivity $\in_r$ which is between 25 and 80. More particularly, when this ratio is between 0.20 and 0.40, $\in_r$ is between 30 and 50.

Advantageously, the portion 1 may be separated from the channel 10 by an intermediate layer 2. Such an intermediate layer 2 facilitates the growth of the hafnium-magnesium mixed oxide on the surface S of the substrate 100, so as to obtain an even interface at the lower boundary of the portion 1.

When the intermediate layer 2 is electrically insulating, it realizes with the portion 1 the insulation 13 between the gate 14 and the channel 10. It is possible for the layer 2 to be continuous on the surface S of the substrate 100, as represented in FIG. 1. It has been observed that silica (SiO$_2$) is a suitable material for forming at least a part of the layer 2, on which the mixed oxide material of the portion 1 can be formed with few defects. For example, the layer 2 may be realized by performing an oxidation of the upper surface of the substrate 100, under controlled conditions.

Preferably, the portion 1 of hafnium-magnesium mixed oxide may be of a thickness which is between 1 and 6 nm, and the intermediate layer 2 of silica may be less than 1.0 nm in thickness, with these thicknesses measured in the direction N, perpendicular to the interface between the portion 1 and the layer 2.

When the relative dielectric permittivity of the portion 1 is equal to 40 and the thicknesses of the portion 1 and of the layer 2 are respectively equal to 4.8 nm (nanometers) and 0.7 nm, the equivalent oxide thickness EOT is equal to 0.7+4.8×3.9/40=1.16 nm. The actual thickness of portion 1, which is significant compared to the usual thickness of a gate insulation layer of silica, ensures a leakage current value which is very low for the transistor in the off state. This value can be less than 10$^{-7}$ A/cm$^2$ (amperes per square centimeter of gate surface area parallel to the surface S) when a voltage of −1 V (Volts) is applied to the gate portion 14 relative to the substrate 100.

In an even more preferred manner, the portion 1 and the layer 2 are of respective thicknesses of between 2 and 3 nm for the portion 1, and 0.5 and 0.8 nm for the layer 2.

The gate portion 14 may itself comprise a portion 3 of polysilicon (poly-Si). Preferably, it also comprises a layer of a metal or of a metal nitride 4 which separates the portion 3 from the portion 1 of hafnium-magnesium mixed oxide. Because a gate portion 3 of polysilicon is used, the MOS process for realizing the gate structure of the transistor is scarcely modified from the conventional process currently in industrial use. The layer 4 may be, for example, of cobalt (Co), copper (Cu), nickel (Ni), tungsten (W), titanium (Ti), tantalum (Ta), iridium (Ir), or an alloy of these metals. It may also be of germanium (Ge) or of a metal nitride which is substantially electrically equivalent to a metal layer. The insertion of such a layer 4 between the portions 1 and 3 ensures that a reducing atmosphere brought into contact with the integrated circuit during the formation of the polysilicon portion 3 causes no reduction of the hafnium-magnesium mixed oxide of the portion 1. For example, the layer 4 may be of a thickness of between 5 and 10 nm, in the direction N perpendicular to the interface between the layer 4 and the portion 1. The material of the portion 1 then undergoes no alteration during the formation of the portion 3. In addition, such a thickness of the layer 4 is sufficiently small, when the gate structure has a total height of about 100 nm in the direction N, that the gate etching step of the MOS transistor realization process is not substantially modified, particularly in its duration.

The sidewall spacer 15 may then be formed in the usual manner, for example by depositing a substantially conformal layer of silicon nitride ($Si_3N_4$) on the circuit, then by a directional etching of this layer parallel to direction N and in the opposite direction.

Figure 2:
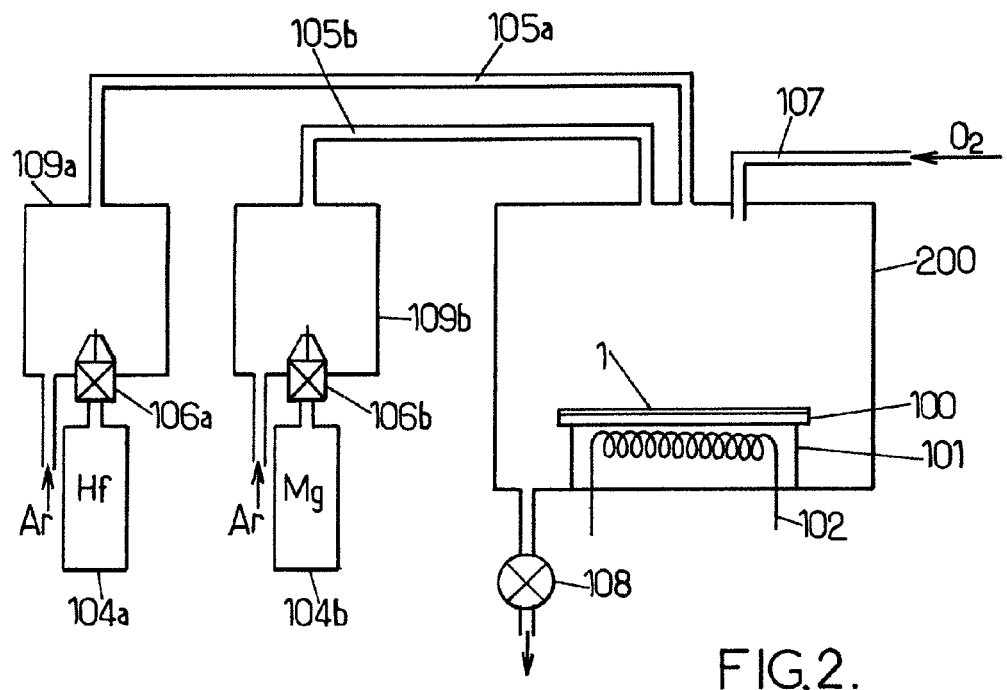
FIG. 2 illustrates a device for forming a thin layer containing a hafnium-magnesium mixed oxide, as part of an integrated electronic circuit.

A process for forming a thin layer of hafnium-magnesium mixed oxide is now described with reference to FIG. 2. For the fabrication of an integrated electronic circuit of the type illustrated in FIG. 1, this process can be implemented between the formation of the intermediate layer 2 and the formation of the layer of metal or metal nitride 4.

The substrate 100 is introduced into a sealed deposition vessel 200. Inside this vessel, it is placed on a support 101 which is equipped with a heating system 102. The vessel 200 is equipped with two precursor introduction systems, a line for introducing reactive gas 107, and a pump-based evacuation system 108. The pump-based system 108 is adjusted relative to the total flow rate of the gases introduced into the vessel 200, in order to obtain a total pressure of the gases in the vessel 200 which can be substantially equal to 1.0 mbar (millibar) for example. The reactive gas can be oxygen ($O_2$), and can be introduced into the vessel 200 in a continuous manner. It is also possible for it to be water vapor ($H_2O$), carbon dioxide ($CO_2$), nitrogen oxide ($N_2O$), etc., in a pure form or in a mixture.

The first precursor introduction system comprises an injector 106a which is connected to the outlet of a source 104a of a hafnium precursor, and pipe 105a for transferring the precursor to the enclosure 200. Similarly, the second precursor introduction system comprises an injector 106b connected to the outlet of a source 104b of a magnesium precursor, and transfer pipe 105b. The systems for introducing hafnium and magnesium precursors into the vessel 200 are preferably separate, to allow independently adjusting the respective quantities of these precursors in the vessel 200. The injectors 106a and 106b have outlets which empty into respective evaporators 109a and 109b, which themselves have outlets connected to the vessel by the pipes 105a and 105b. The hafnium and magnesium precursors from sources 104a and 104b are selected so as to be in a liquid state in these sources, up to the outlets of the injectors 106a and 106b. They are immediately vaporized after their introduction into the corresponding evaporators, then transferred to the vessel 200 via the pipes 105a and 105b in the form of vapor. To achieve this, the pipes, as well as the evaporators 109a and 109b, may be heated.

A carrier gas, which may be argon (Ar) or nitrogen ($N_2$), is additionally brought into the vessel 200. In order to carry the vapors of the hafnium and magnesium precursors efficiently, it is preferably introduced into the evaporators 109a and 109b.

The injectors 106a and 106b may be of a model which opens intermittently, for example at a frequency which is between 0.1 and 10 Hz (Hertz) and with a ratio of the duration of time open to the duration of an injection cycle which is between $\frac{1}{50}$ and $\frac{1}{2}$. The respective durations for the two injectors 106a and 106b be open may be adjusted to obtain partial pressures of hafnium and magnesium precursors in the vessel 200 which, for example, are substantially equal to $5.2\times10^{-6}$ mbar and $3.4\times10^{-6}$ mbar respectively.

The hafnium precursor may be hafnium tetra-tert-butoxide ($Hf(O^tBu)_4$) or hafnium di-tert-butoxy-dimethoxy-methyl-propoxide ($Hf(O^tBu)_2(mmp)_2$). The magnesium precursor may be magnesium ditetramethyl-heptanedionate ($Mg(tmhd)_2$).

The process used is chemical vapor deposition from organometallic precursors and with pulsed liquid injection. The temperature of the substrate 100 during the deposition is between 400° C. and 600° C., and the concentrations of the precursors present in gaseous form inside the vessel 200 are adjusted to obtain a rate of formation of the hafnium-magnesium mixed oxide layer 1 of on the order of 0.6 nm per minute. Under these conditions, the mixed oxide layer 1 has a residual carbon concentration which is very low. The obtained layer 1 thus corresponds to the chemical formula $HfMg_xO_y$, or to a mixture of a compound associated with this formula and of magnesium oxide MgO.

During the fabrication of an integrated electronic circuit as illustrated in FIG. 1, the continuous layer 1 of hafnium-magnesium mixed oxide obtained by a process as described above is etched after the step commonly called gate etching. This etching of the layer 1 is directional etching, and is commonly performed by means of a plasma in which the particles are accelerated in the direction of the circuit surface, parallel to the direction N.

It is understood that numerous modifications may be introduced into the process of forming a layer of hafnium-magnesium mixed oxide which has just been described. In particular, a single source for the precursors of the two metals may be used, containing a mixture of the respective precursors. The proportions of the mixture are then adapted to obtain the desired stoichiometry of the mixed oxide. Lastly, the numeral values cited above for the deposition parameters are only provided as an illustration, and may be modified while still obtaining a mixed oxide layer according to the invention.

Although preferred embodiments of the method and apparatus have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

The invention claimed is:

1. Integrated electronic circuit comprising at least one thin layer portion based on hafnium oxide, this portion further containing magnesium atoms in the form of a mixed oxide of hafnium and magnesium, wherein the mixed oxide of hafnium and magnesium portion at least partially has a tetragonal or orthorhombic crystalline structure and has a dielectric permittivity comprised between 30 and 50.

2. Circuit according to claim 1, in which the mixed oxide of hafnium and magnesium has a first part having the tetragonal or orthorhombic crystalline structure, and further has a second part that is one of amorphous or has a cubic crystalline structure.

3. Circuit according to claim 1, in which the proportion of magnesium atoms with respect to a total quantity of magnesium and hafnium atoms contained in the mixed oxide portion is comprised between 0.20 and 0.40.

4. Circuit according to claim 1, in which the portion of mixed oxide of hafnium and magnesium constitutes a part at least of a capacitor dielectric of said circuit.

5. Circuit according to claim 1, in which the portion of mixed oxide of hafnium and magnesium constitutes a part at least of a gate insulating film of an MOS transistor of said circuit.

6. Integrated electronic circuit comprising:
at least one thin layer portion based on hafnium oxide, this portion further containing magnesium atoms in the form of a mixed oxide of hafnium and magnesium, wherein the mixed oxide of hafnium and magnesium portion has a dielectric permittivity comprised between 30 and 50;
in which the portion of mixed oxide of hafnium and magnesium constitutes a part at least of a gate insulating film of an MOS transistor of said circuit; and
in which the portion of mixed oxide of hafnium and magnesium is separated from a channel of the transistor by an intermediate layer.

7. Circuit according to claim 6, in which the intermediate layer is at least partially based on silica.

8. Circuit according to claim 6, in which the portion of mixed oxide of hafnium and magnesium has a thickness comprised between 1 and 6 nm, and the intermediate layer has a thickness of less than 1.0 nm, said thicknesses being measured in a direction perpendicular to an interface between the mixed oxide of hafnium and magnesium portion and the intermediate layer.

9. Circuit according to claim 8, in which the portion of mixed oxide of hafnium and magnesium has a thickness comprised between 2 and 3 nm, and the intermediate layer has a thickness comprised between 0.5 and 0.8 nm.

10. Circuit according to claim 5, in which the transistor gate comprises a polysilicon portion.

11. Integrated electronic circuit comprising at least one thin layer portion based on hafnium oxide, this portion further containing magnesium atoms in the form of a mixed oxide of hafnium and magnesium, wherein the mixed oxide of hafnium and magnesium portion has a dielectric permittivity comprised between 30 and 50;
in which the portion of mixed oxide of hafnium and magnesium constitutes a part at least of a gate insulating film of an MOS transistor of said circuit;
in which the transistor gate comprises a polysilicon portion; and
in which the polysilicon portion of the gate is separated from the mixed oxide of hafnium and magnesium portion of the gate insulating layer by a metal or metallic nitride layer.

12. Circuit according to claim 11, in which the metal or metallic nitride layer has a thickness comprised between 5 and 10 nm, in a direction perpendicular to an interface between said metal or metallic nitride layer and the polysilicon portion.

13. An integrated electronic circuit comprising:
a substrate in which circuits are formed; and
a thin layer in the form of a hafnium-and-magnesium mixed oxide at least partially having a tetragonal or orthorhombic crystalline structure and having a dielectric permittivity in excess of 25.

14. The circuit of claim 13 wherein the thin layer is an insulating layer for a gate of a transistor.

15. The circuit of claim 13 wherein the thin layer is an insulating layer for a capacitor structure.

16. An integrated electronic circuit comprising at least one thin layer portion based on hafnium oxide, said portion additionally containing magnesium atoms, so that the portion is in the form of a hafnium-and-magnesium mixed oxide at least partially having a tetragonal or orthorhombic crystalline structure.

17. The circuit according to claim 16, wherein the portion of hafnium-and-magnesium mixed oxide has a dielectric permittivity of between 25 and 80.

18. The circuit according to claim 16, wherein the portion of hafnium-and-magnesium mixed oxide has a dielectric permittivity of between 30 and 50.

19. The circuit according to claim 16, wherein the hafnium-and-magnesium mixed oxide has a first part having the tetragonal or orthorhombic crystalline structure, and further has a second part that is at least in part amorphous.

20. The circuit according to claim 16, wherein the hafnium-and-magnesium mixed oxide has a first part having the tetragonal or orthorhombic crystalline structure and further has a second part that has a structure other than a tetragonal or orthorhombic crystalline structure.

21. The circuit according to claim 1, wherein a proportion of magnesium atoms relative to a total quantity of magnesium and hafnium atoms contained in the mixed oxide portion is between 0.15 and 0.50.

22. The circuit according to claim 21, wherein the proportion of magnesium atoms relative to the total quantity of magnesium and hafnium atoms contained in the mixed oxide portion is between 0.20 and 0.40.

23. The circuit according to claim 16, wherein the portion of hafnium-and-magnesium mixed oxide constitutes at least a part of a dielectric of a capacitor of said circuit.

24. The circuit according to claim 16, wherein the portion of hafnium-and-magnesium mixed oxide constitutes at least a part of a gate insulation layer of a MOS transistor.

25. An integrated electronic circuit comprising at least one thin layer portion based on hafnium oxide, said portion additionally containing magnesium atoms, so that the portion is in the form of a hafnium-and-magnesium mixed oxide;
wherein the portion of hafnium-and-magnesium mixed oxide constitutes at least a part of a gate insulation layer of a MOS transistor; and
wherein the portion of hafnium-and-magnesium mixed oxide is separated from a channel of the transistor by an intermediate layer.

26. The circuit according to claim 25, wherein the intermediate layer is at least partially silica-based.

27. The circuit according to claim 16, wherein the portion of hafnium-and-magnesium mixed oxide is of a thickness of between 1 and 6 nm.

28. The circuit according to claim 16, wherein the portion of hafnium-and-magnesium mixed oxide is of a thickness of between 2 and 3 nm.

* * * * *